United States Patent [19]

Pinkham

[11] 4,287,489
[45] Sep. 1, 1981

[54] AMPLITUDE LIMITED VARACTOR TUNED L-C OSCILLATOR

[75] Inventor: Clinton L. Pinkham, New Hartford, N.Y.

[73] Assignee: General Electric Company, New York, N.Y.

[21] Appl. No.: 77,129

[22] Filed: Sep. 19, 1979

[51] Int. Cl.³ .............................................. H03B 5/12
[52] U.S. Cl. ............................ 331/117 R; 331/177 V
[58] Field of Search ............ 331/117 R, 117 FE, 167, 331/177 V

[56] References Cited

U.S. PATENT DOCUMENTS

| 3,407,363 | 10/1968 | Kaiser et al. | 331/117 R |
| 3,541,450 | 11/1970 | Paine et al. | 331/117 R X |
| 3,894,229 | 7/1975 | Mouri | 331/117 R X |
| 4,009,454 | 2/1977 | Darrow | 331/117 R |

Primary Examiner—Siegfried H. Grimm
Attorney, Agent, or Firm—Carlos Nieves; George R. Powers; Leonard J. Platt

[57] ABSTRACT

An electronically tunable oscillator comprises a transistor coupled to ground by an emitter resistor. The collector and base of the transistor are interconnected through an inductor which has a tap connected to a bypass capacitor and a B+ voltage source. The source maintains the collector and base at the same DC potential. The collector of the transistor is coupled to a capacitance which cooperates with the inductor to provide a tuned circuit. At least part of the capacitance is provided by a varactor whose value can be controlled to determine oscillator frequency. The magnitude of the oscillator frequency is limited to two times the base to emitter voltage of the transistor and the use of the emitter resistor cooperates to minimize distortion.

6 Claims, 2 Drawing Figures

AMPLITUDE LIMITED VARACTOR TUNED L-C OSCILLATOR

BACKGROUND OF THE INVENTION

1. Field of the Invention

The subject invention relates to tunable semiconductor oscillators.

2. Description of Prior Art

Prior art considered to be relevant herein is disclosed in U.S. Pat. No. 4,009,454, issued on Feb. 22, 1977, on an invention by J. Darrow and in U.S. Pat. No. 3,407,363, issued on Oct. 22, 1968, on an invention by N. Kaiser et al.

U.S. Pat. No. 4,009,454 discloses a constant amplitude signal generating circuit, the circuit comprising a shunt type voltage regulator providing a constant voltage source to a free-running transistor oscillator. The regulator includes first and second series connected resistors in series with a B+ supply and a zener diode, the anode of the diode being connected to a grounded terminal of the supply. A junction common to the first and second resistors is coupled to ground by third and fourth series connected resistors and a junction common to the third and fourth resistors is coupled via a feedback winding of a transformer to the base of a transistor of the oscillator. The collector of the transistor is connected by the primary winding of the transformer to the second resistor and the cathode of the zener diode and is coupled by a capacitor to ground. In addition, the emitter of the transistor is coupled by a feedback resistor to ground. Inductance provided by the transformer and the capacitor determine the frequency of oscillation of the circuit. The values of the second, third, and fourth resistor are chosen such that the DC operating point of the transistor is on the linear portion of the dynamic transfer characteristic curve. In operation, the transistor is alternately driven between saturation and cutoff. Therefore, a slight clipping effect is associated with the signal generated. An output signal, similar to the generated signal, is provided by a secondary coil of the transformer.

U.S. Pat. No. 3,407,363 discloses a varactor tuned oscillator. The oscillator comprises a transistor whose base is coupled to its collector by a turned circuit which includes an inductor connected in parallel with a pair of series connected varactors. A DC source coupled to the emitter of the transistor and a center tap on the inductor supplies power to the oscillator. The oscillator is said to operate in class C.

SUMMARY OF THE INVENTION

It is an object of the present invention to provide a tunable oscillator providing an amplitude limited signal having only a small amount of harmonic distortion.

It is another object of the present invention to provide an oscillator having a tuned circuit which includes a varactor, the varactor being tunable with low bias voltages without causing self rectification to take place at the varactor.

It is still another object of the present invention to provide a varactor tuned oscillator capable of providing a low distortion periodic signal with a minimal number of parts.

Yet another object of the present invention is to provide a varactor tuned oscillator suitable for use as a local oscillator in an AM radio broadcast receiver.

Structurally, a tunable oscillator circuit, according to the invention, includes: a DC voltage source having first and second terminals; a transistor having an emitter electrode, a base electrode, and a collector electrode; a resistor; a tapped inductor; and a variable capacitor. The resistor is coupled at one end to the emitter electrode and at a second end to the second terminal of the voltage source. The inductor is connected in series with the collector and base electrodes and its tap is coupled to the first terminal of the voltage source. The variable capacitor is coupled at one end to the collector electrode and at the other of its ends to the second end of the resistor.

BRIEF DESCRIPTION OF THE DRAWINGS

The above-mentioned and other objects and features of the invention will become apparent by reference to the following description in conjunction with the accompanying drawings, in which.

DESCRIPTION OF A PREFERRED EMBODIMENT

Figure 1:
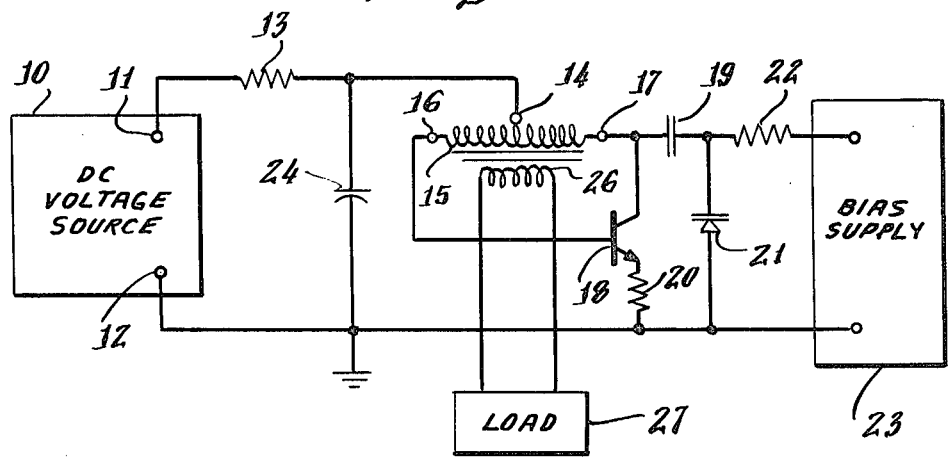
FIG. 1 is a schematic diagram of a tunable oscillator, according to the invention.
Figure 2:
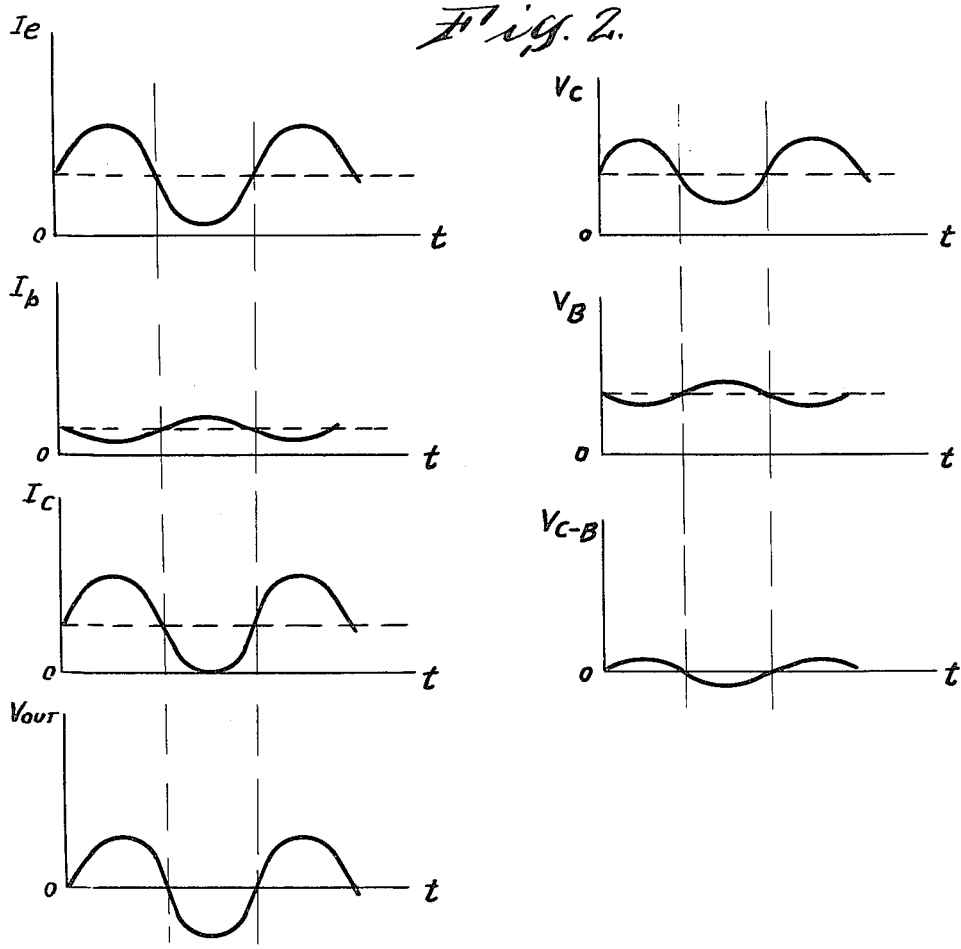
FIG. 2 is a set of waveforms which represent currents associated with a transistor of the oscillator and the output voltage of the oscillator.

FIG. 1 shows a schematic diagram of a tunable oscillator circuit which incorporates the invention. Referring to FIG. 1, the circuit includes a DC voltage source 10 having a terminal 11 and a terminal 12. Terminal 11 is coupled by a resistor 13 to a tap 14 on an inductor 15 and to an end of a capacitor 24, the other end of the capacitor being coupled to terminal 12. One end 16 of the inductor is connected to the base electrode of an NPN transistor 18 and the other end 17 of the inductor is connected to an end of a DC blocking capacitor 19 and to the collector electrode of the transistor. The emitter electrode of the transistor is coupled by a resistor 20 to terminal 12 and to the anode end of a varactor 21. The cathode end of varactor 21 is coupled to the other end of capacitor 19 and to an end of a resistor 22, which is used to couple the varactor to a bias supply 23. A coil 26, mutually coupled to inductor 15, couples the oscillator to a load 27.

In the circuit, the sum resistance provided by resistors 13 and 20 and the magnitude of the voltage of source 10 minus the base to emitter voltage of transistor 18 determine the current in the transistor. Capacitor 24 has a magnitude sufficient to function as a high frequency bypass. In fact, the impedance of the capacitor over the designed oscillator frequency range is very low. Therefore, the DC source is decoupled from the oscillator at oscillator frequencies.

The inductor 15 is a coil having $N_1$ turns between the tap 14 and end 17, and $N_2$ turns between tap 14 and end 16. The feedback ratio of $N_2/N_1$ times the voltage gain of the transistor amplifier principally determine necessary gain conditions for oscillation. The voltage gain of the transistor amplifier at the resonant frequency is approximately equal to the impedance at the collector divided by the value of resistor 20. Since capacitor 24 has a low impedance at oscillator frequencies, the inductance between terminals 14 and 17 and the value of the capacitance provided by the varactor and capacitor 19 primarily determine the frequency of oscillation. The word primarily is used because it must be recognized that the output capacitance of the transistor and other stray capacitances which are related to circuit layout affect the actual frequency of oscillation.

Since the collector and base electrodes are at the same DC potential, when the circuit is oscillating the voltage across the inductor 15 causes the transistor to alternately operate in its saturated region and in its active region. When the collector to base junction of the transistor is driven into a forward biased state, the gain of the transistor decreases, limiting the collector to base forward excursion to about the same voltage as the transistors forward bias base to emitter voltage. The flywheel effect of the tank circuit comprising varactor 21, capacitor 19, and inductor 15 keeps the forward and reverse bias excursions about the same and, therefore, the total collector peak to peak AC potential is approximately twice the value of the forward bias base to emitter voltage.

Resistor 20 affects the voltage gain of the transistor and is selected so that the oscillator produces a relatively low distortion signal over the band of frequencies which the oscillator is to be capable of providing.

A circuit such as described has been manufactured using a 2N918 transistor and an MVAM115 varactor. The varactor provides capacitance in the 30 to 500 pf range with voltage variations between −1 and −20 volts. With a supply voltage of 9 volts, resistance values of 8.2 K ohms, 470 ohms and 100 K ohms have been used for resistors 13, 20 and 22, respectively. Capacitors having values of 430 uuf and 0.047 uf have been used for capacitors 19 and 24. A 114 microhenry tapped coil inductor having 60 turns is used for inductor 15. In this inductor $N_1$ equals 59 and $N_2$ equals 1. Coil 26 has 3.5 turns.

A bias supply variation from 1.5 volts to 15 volts varies the frequency of oscillation of the circuit from 985 khz to 2065 khz.

The manufactured circuit was intended for use as a local oscillator in an AM broadcast superhetrodyne receiver and, therefore, the value of capacitor 19, which is normally referred to as a "padder", was selected employing tracking considerations.

Worst case distortion for the oscillator occurs at the high band end because the impedance of the tank circuit and the amplifier gain are greatest at the high band end. The worst case distortion for the manufactured oscillator is typically less than 5%.

The circuit described above may be modified by persons skilled in the art to which the invention pertains in ways which are consistent with the spirit of the invention. Therefore, it should be understood that the description herein of a preferred embodiment, according to the invention, has been set forth as an example thereof and should not be construed or interpreted to limit the scope of the claims which follow and define the invention.

I claim:

1. A tunable oscillator, comprising:
   (a) a DC voltage source having first and second terminals;
   (b) a transistor having an emitter electrode, a base electrode and a collector electrode;
   (c) a resistor coupled at one end to the emitter electrode and at a second end to the second terminal of the voltage source;
   (d) an inductor DC connected between the collector and base electrodes, the inductor having a tap between its ends, the tap being coupled to the first terminal of the voltage source to keep the collector and base electrodes at substantially the same DC potential;
   (e) an AC by-pass capacitor coupling the tap to the second terminal of the voltage source; and
   (f) a variable capacitor coupled at one end to the collector electrode and at the other of its ends to said second end of the resistor, whereby the oscillator operates with a peak to peak AC potential, between the collector electrode and the second terminal, which is limited to substantially twice the forward bias base to emitter voltage of the transistor.

2. A tunable oscillator as defined in claim 1 wherein the variable capacitor is a varactor, wherein the varactor is coupled to the collector electrode by a capacitor and further including means for biasing the varactor.

3. A tunable oscillator as defined in claim 2 wherein said inductor is a coil having a tap between its ends, the tap being coupled to said first terminal by a bias resistor.

4. A tunable oscillator as defined in claim 3, further including a coil inductively coupled to the inductor for supplying an AC signal to a load.

5. A tunable oscillator circuit of the type powered by a DC voltage source having first and second terminals at difference voltage potentials, comprising:
   (a) a transistor having an emitter electrode, a base electrode and a collector electrode;
   (b) a resistor coupled at one end to the emitter electrode;
   (c) means for coupling the other end of the resistor to the second terminal of the voltage source;
   (d) an inductor DC connected between the collector and base electrodes, the inductor having a tap between its ends;
   (e) means for coupling the tap to the first terminal of the voltage source to keep the collector and base electrodes at substantially the same DC potential;
   (f) an AC by-pass capacitor coupling the tap to said means for coupling the other end of the resistor to the second terminal; and
   (g) a variable capacitor coupled at one end to the collector electrode and at the other of its ends to said second end of the resistor, whereby when the circuit is coupled to the voltage source the oscillator operates with a peak to peak AC potential, between the collector electrode and the other end of the resistor, which is limited to substantially twice the forward bias base to emitter voltage of the transistor.

6. A tunable oscillator circuit as defined in claim 5 wherein the variable capacitor is a varactor, wherein the varactor is coupled to the collector electrode by a capacitor and further including means for biasing the varactor.

* * * * *